United States Patent [19]
Chen et al.

[11] Patent Number: 5,660,894
[45] Date of Patent: Aug. 26, 1997

[54] PROCESS FOR DEPOSITING DIAMOND BY CHEMICAL VAPOR DEPOSITION

[75] Inventors: Chia-Fu Chen, Hsinchu; Sheng-Hsiung Chen, Tai-Ya Hsiang; Tsao-Ming Hong, Erh-Lin Chen, all of Taiwan

[73] Assignee: National Science Council, Taipei, Taiwan

[21] Appl. No.: 543,373

[22] Filed: Oct. 16, 1995

[51] Int. Cl.$^6$ .............................. B05D 3/06; C23C 16/26
[52] U.S. Cl. ........................ 427/577; 427/575; 427/249; 427/255.1; 427/122
[58] Field of Search .................................. 427/249, 577, 427/575, 573, 122, 255.1; 423/446; 428/408

[56] References Cited

PUBLICATIONS

Appl. Phys. Lett. 56(5), Jan. 29, 1990 by Weimer et al., entitled "Diamond Deposition at Low Substrate Temperatures", pp. 437–439.

Elsevier Science Publishers, 1992 by Ihara et al., entitled "Low–Temperature Deposition of Diamond in Temperature Range from 70 ° C to 700 ° C", pp. 187–190.

Journal of Crystal Growth 99 (1990) by Wei et al., entitled "Growth of Diamond Films at Low Pressure Using Magneto–Microwave Plasma CVD", pp. 1201–1205.

Publication entitled "Low–Temperature Synthesis of Diamond Films Using Magneto–Microwave Plasma CVD", pp. 1483–1485.

Surface and Coatings Technology, 47 (1991) by Muranaka et al., entitled "Low Temperature Growth of Highly Purified Diamond Films Using Microwave Plasma–Assisted Chemical Vapour Deposition", pp. 1–11.

Chen et al, Surf. Coat. Technol. 52(3) 1992 pp. 205–209.

Pierson, "Handbook of Chemical Vapor Deposition (CVD) Principles, Technology and Applications", Noyes Publications, 1992 pp. 169–178.

*Primary Examiner*—Roy V. King
*Attorney, Agent, or Firm*—Curtis, Morris & Safford, P.C.

[57] ABSTRACT

The present invention provides a process for depositing diamond by chemical vapor deposition without using conventionally-used hydrogen, which is an explosive gas, as a reaction gases. The process includes contacting a substrate with a two-component gas mixture, under the conditions of a substrate temperature of 150° C.–900° C., a pressure of 1–50 torr, an input microwave power of 250–450 W. The two-component gas mixture is a hydrocarbon ($C_xH_y$) plus $CO_2$ with a flow rate ratio of the $C_xH_y$ to $CO_2$ of 0.2–0.8, or a gasified liquid state oxygen-containing hydrocarbon ($C_xH_yO_z$) plus $CO_2$ with a flow rate ratio of the $C_xH_yO_z$ to $CO_2$ of 12–17. High quality diamond can be obtained even at low temperature of 180° C.

19 Claims, 16 Drawing Sheets

PROCESS FOR DEPOSITING DIAMOND BY CHEMICAL VAPOR DEPOSITION

BACKGROUND OF THE INVENTION

1. Field of the Invention

The present invention relates to a process for depositing diamond by chemical vapor deposition, more particularly to a process for depositing diamond without using conventionally-used hydrogen, which is an explosive gas, as a reaction gas, and to a process for depositing diamond at temperature below 400° C.

2. Description of the Prior Art

Diamond, which is the hardest substance (about Hv 10,000 kg/mm$^2$) in the world, has very high thermal conductivity (about 24 watt/°C.-cm), and good insulating properties (about $10^{13}$–$10^{16}$ Ωcm/15° C.). In addition, it is transparent within the ultra-violet, visible and infra-red spectrum. Diamond is also resistant to chemical corrosion, low in friction, and high in sonic propagation speed. Therefore, diamond is a valuable material with many special characterstics not found in other materials. For example, diamond may become semi-conductive if a small amount of phosphorols or boron is added to a diamond film. As a result, diamond is regarded as an important material in electronic and defense industry application.

Synthetic diamond was previously used in the manufacture of tools. In the past few years, techniques for producing artificial diamond have improved greatly, expanding the range of applicability of synthetic diamond into such industries as optical instruments, semi-conductor elements, VLSI integrated circuit heat sinks, horn-like vibrating plates, the reflection resistant film of solar batteries, and various other mechanical tools.

Diamond films are usually synthesized from gas mixtures that include a small amount of hydrocarbon in hydrogen which is an explosive gas, and the typical growth temperature is 700°–1000° C. For many applications, it is important to grow diamond films at low temperatures (below 500° C.), because many substrate materials, such as GaAs, plastics, ZnS and MgF$_2$, are unstable at high temperature.

Deposition of diamond films at low temperature can be achieved by altering deposition techniques and reaction gases.

For example, Liou et al. use microwave plasma chemical vapor deposition (MPCVD) to deposit diamond. The reaction gases are H$_2$/CH$_4$/O$_2$. Diamond can be deposited at temperatures above 400° C. (Appl. Phys. Lett. 56(5), p. 437(1990)).

Yasuchi et al. also synthesize diamond by MPCVD. The reaction gases are CO/O$_2$/H$_2$. It is confirmed that diamond can be grown at temperatures above 400° C. (Surface and Coatings Technology, 47(1991), p. 1).

Wei et al. disclose that diamond films can be grown by magneto-microwave plasma CVD with CH$_4$+CO$_2$/H$_2$ gas mixture at temperature above 500° C. (Journal of Crystal Growth, 99(1990), p. 1201).

All the above processes for depositing diamond have the common problem that a large amount of H$_2$ which is an explosive gas is required, thus causing possible danger. Another problem is that the deposition must be carried out at temperatures higher than 400° C., thus requiring high energy and limiting the substrates which can be used.

SUMMARY OF THE INVENTION

An object of this invention is therefore to solve the above-mentioned problems and to provide a process for depositing high quality diamond without the use of an explosive gas i.e., hydrogen.

Another object of this invention is to provide a process for depositing high quality diamond at a much lower temperature, i.e., at a temperature below 400° C. Also, the growth rate of diamond is relatively fast.

To achieve the above object, the process for depositing diamond of the present invention uses a chemical vapor deposition process, and includes contacting a substrate with a two-component gas mixture, under the conditions of a substrate temperature of 150° C.–900° C., a pressure of 1–50 torr, an input microwave power of 250–450 W. The two-component gas mixture can be a hydrocarbon (C$_x$H$_y$) plus CO$_2$ with a flow rate ratio of the C$_x$H$_y$ to CO$_2$ of 0.2–0.8, or a gasified liquid state oxygen-containing hydrocarbon (C$_x$H$_y$O$_z$) plus CO$_2$ with a flow rate ratio of the C$_x$H$_y$O$_z$ to CO$_2$ of 12–17.

DETAILED DESCRIPTION OF THE INVENTION

According to the present invention, the process for depositing diamond can be a chemical vapor deposition (CVD) process, such as microwave plasma CVD process, R.F. plasma CVD process and hot filament CVD process.

Figure 1:
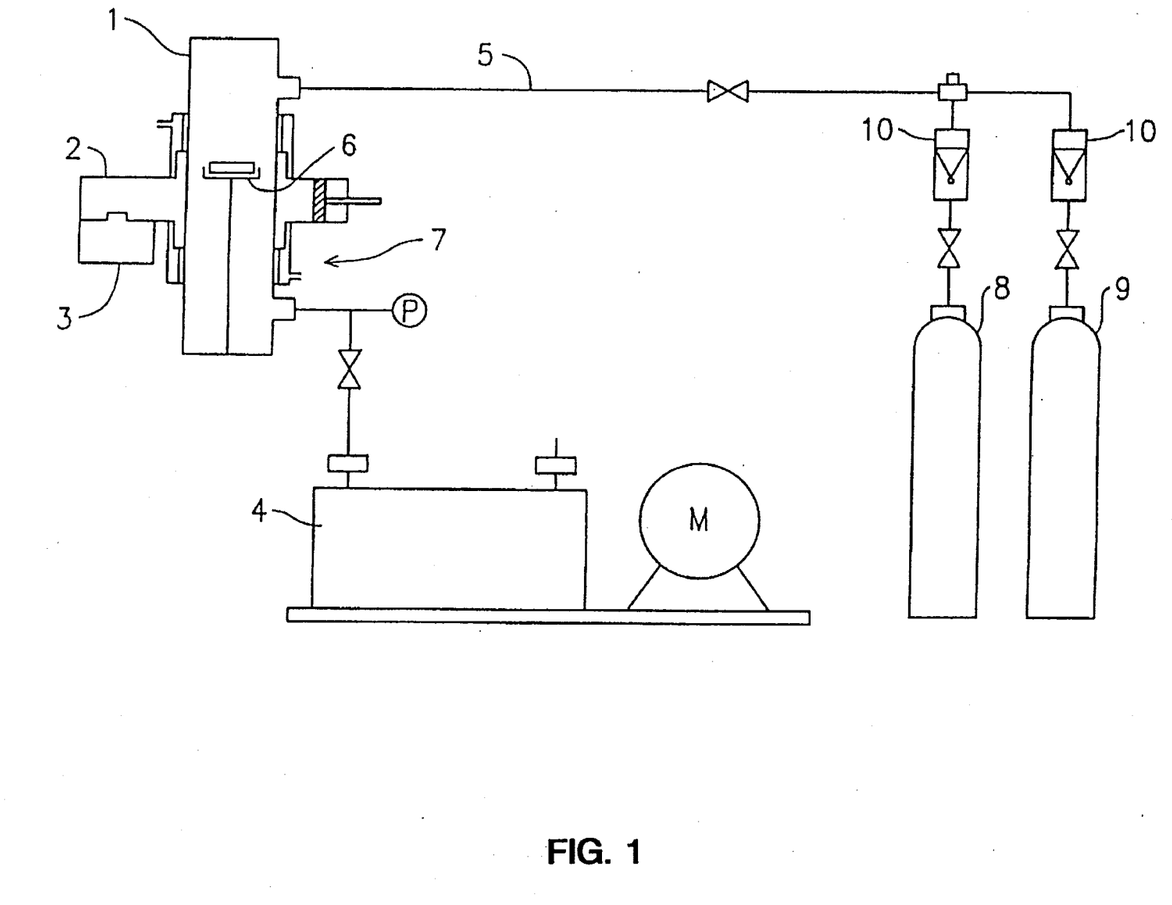
FIG. 1 is a schematic diagram of the microwave plasma CVD apparatus of the present invention.

In the following examples, the microwave plasma CVD process is used to deposit diamond. A schematic diagram of the apparatus for performing this process is shown in FIG. 1. In this figure, a reaction chamber 1 is connected to a microwave generator 3 with a waveguide 2, and is also connected at the bottom to a vacuum system 4 and at the top to gas supply systems 8 and 9 with a gas supply line 5. A substrate holder 6 is disposed in the reaction chamber 1 to hold a substrate. The substrate holder 6 is cooled by a cooling system 7 connected to the reaction chamber 1. The reaction gases to be deposited, for example, $CO_2$ and $CH_4$, are supplied from their respective gas supply systems 8 and 9 via flow controllers 10 into the reaction chamber 1.

The reaction gases suitable for use in the present invention are a two-component gas mixture. The two-component gas mixture can be a hydrocarbon ($C_xH_y$) plus $CO_2$ or a gasified liquid state oxygen-containing hydrocarbon ($C_xH_yO_z$) plus $CO_2$. Examples of the $C_xH_y$ are $CH_4$, $C_2H_2$, $C_2H_4$, $C_3H_8$, $C_4H_{10}$ and $C_6H_6$. Examples of the $C_xH_yO_z$ are $C_3H_6O_3$, $CH_3OH$, $CH_3COCH_3$, $CH_3COOCH_3$, $C_2H_5OH$ and $C_2H_5OC_2H_5$.

According to the present invention, the substrate temperature is controlled in the range of 150°–900° C., the pressure in the range of 1–50 torr, the input microwave power in the range of 250–450 W, the flow rate of the $C_xH_y$ to $CO_2$ in the range of 0.2–0.8, and the flow rate of the $C_xH_yO_z$ to $CO_2$ in the range of 12–17.

The substrate temperature is measured with an optical pyrometer end a K-type thermocouple in direct contact with the graphite substrate holder. The exact temperature of the growth surface is calibrated by the melting point method, such as lead (m.p.=335° C.) and tin (m.p.=243° C.). Thus, we can be sure that the exact substrate surface temperature, is 65°±10° C. higher than the thermocouple readout. The values for the temperature shown in the present invention are the true substrate surface temperature.

The following specific examples are intended to demonstrate this invention more fully without acting as a limitation upon its scope, since numerous modifications and variations will be apparent to those skilled in the art.

EXAMPLE 1

Figure 2:
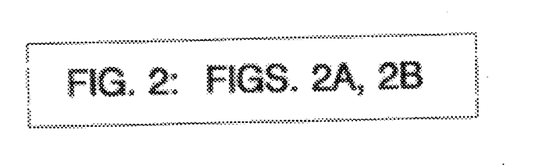
FIGS. 2a and 2b are the SEM micrograph of the diamond film obtained from Example 1 of the present invention.
Figure 2A:
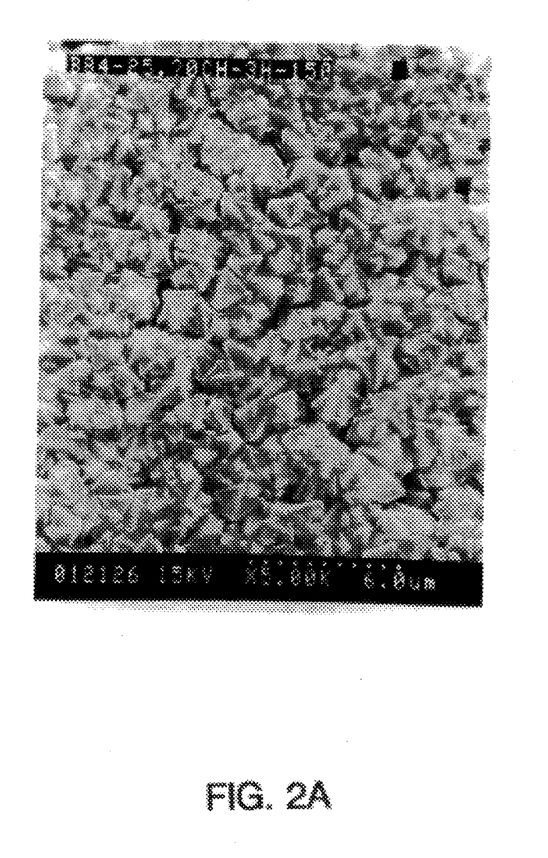
Figure 2B:
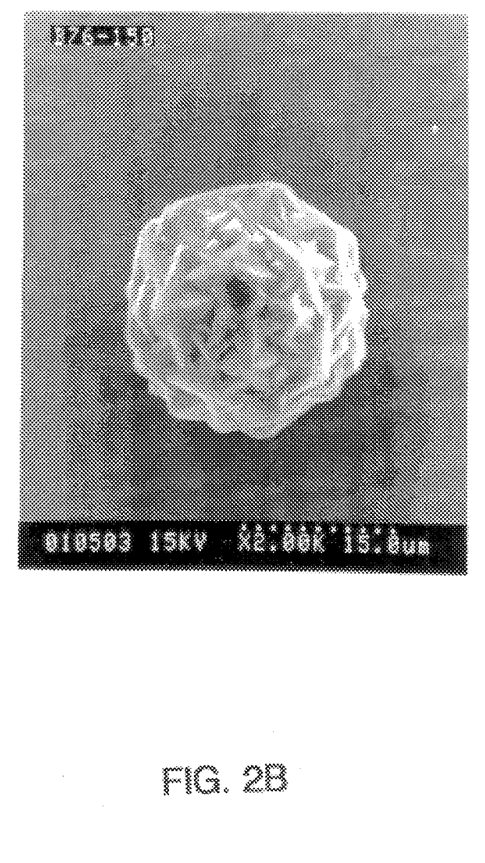

The apparatus as illustrated in FIG. 1 was employed in this example. A silicon wafer substrate (10 mm×10 mm) was scratched with diamond powder and then was placed on the substrate holder 6, having a diameter of 15 mm, located at the center of the reaction chamber 1 with an outer diameter of 55 mm. During the deposition process, the substrate was heated up to 850° C. by microwave plasma. The pressure in the reaction chamber 1 was maintained at 25 torr and the input microwave power was 400 W. The reaction gases were $CO_2$—$C_2H_2$ and the flow rates of $CO_2$ and $C_2H_2$ were 30.0 ml/min and 14 ml/min respectively. After a total deposition time of 3 hours, a 2.7 μm thick diamond film of good crystallinity was obtained. The growth rate of the diamond film was 0.9 μm/hr. The SEM micrograph of the diamond film is shown in FIG. 2. To obtain a high quality diamond film, when the flow rate of $CO_2$ is kept at 30.0 ml/min, the flow rate of $C_2H_2$ is preferably maintained in the 13.8–14.5 ml/min range.

EXAMPLE 2

Figure 3:
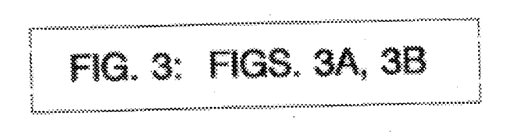
FIGS. 3a and 3b are the SEM micrograph of the diamond film obtained from Example 2 of the present invention.
Figure 3A:
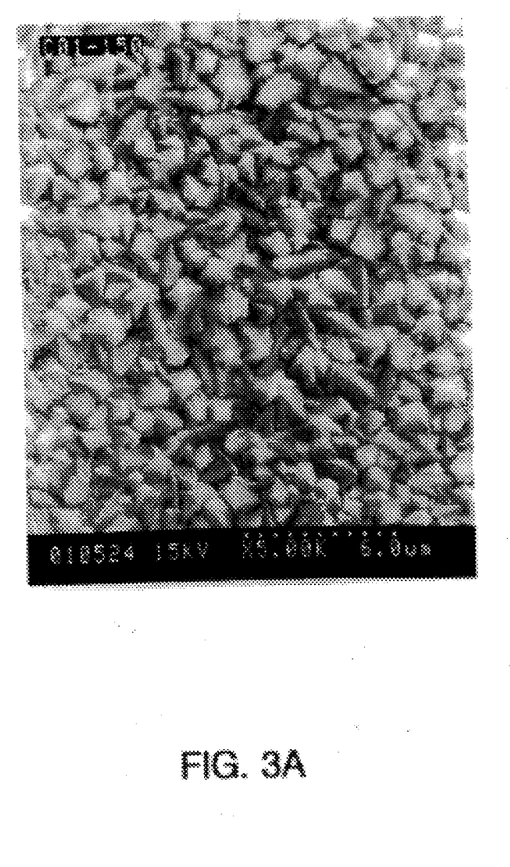
Figure 3B:
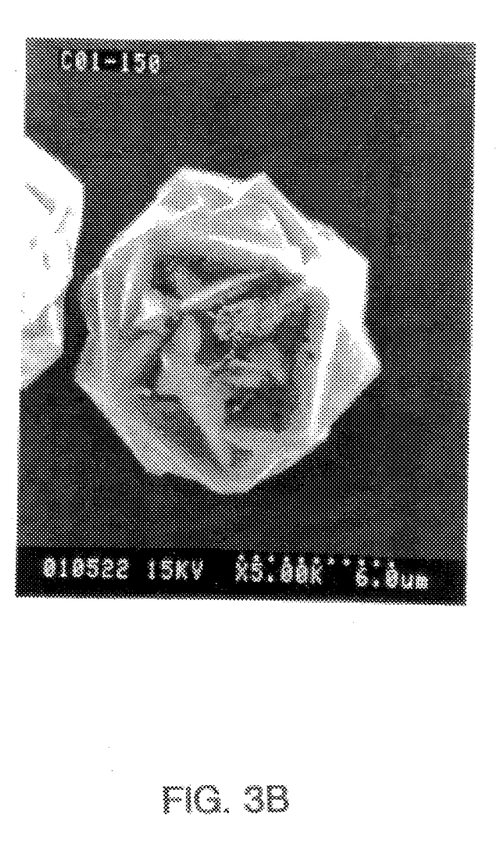

The same apparatus and process as described in Example 1 were employed except that the reaction gases used were $CO_2$—$CH_4$ with flow rates of 30.0 ml/min and 21.1 ml/min respectively. After a total deposition time of 3 hours, a 6 μm thick diamond film of good crystallinity was obtained as shown in FIG. 3. The growth rate of the diamond film was 2 μm/hr. To obtain a high quality diamond film, when the flow rate of $CO_2$ is kept at 30.0 ml/min, the flow rate of $CH_4$ is preferably maintained in the 20.6–21.7 ml/min range.

EXAMPLE 3

Figure 4:
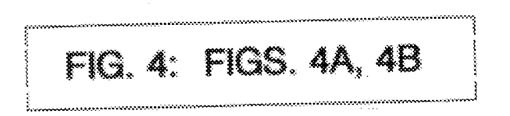
FIGS. 4a and 4b are the SEM micrograph of the diamond film obtained from Example 3 of the present invention.
Figure 4A:
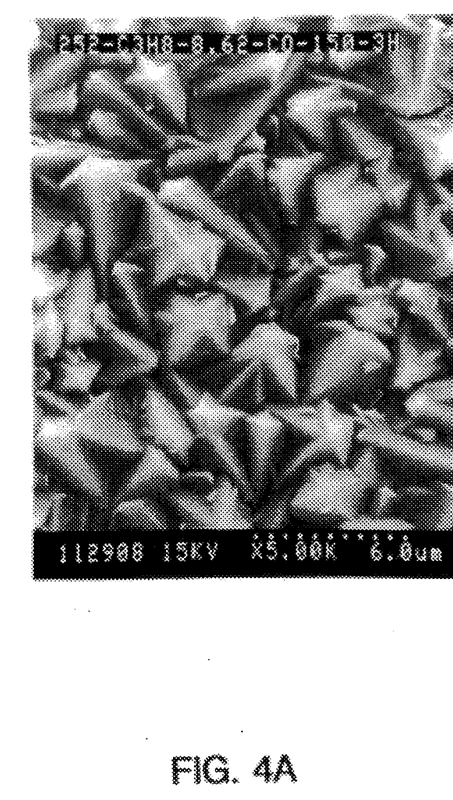
Figure 4B:
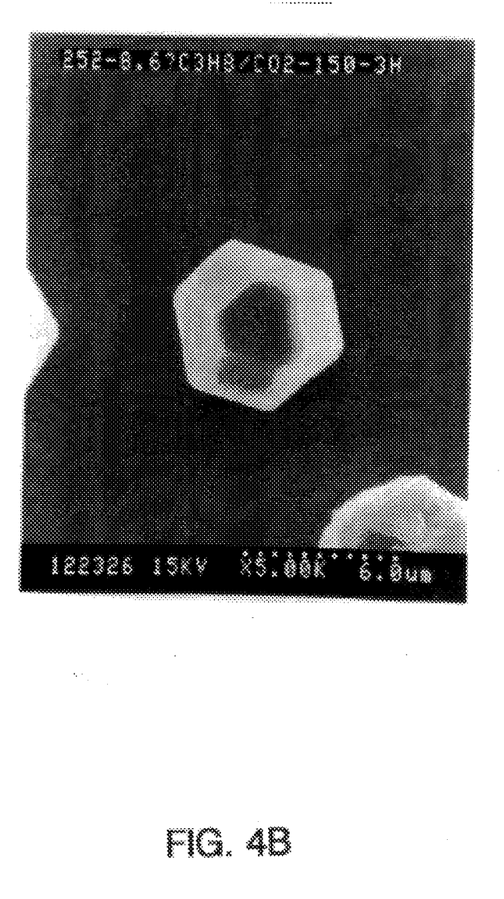

The same apparatus and process as described in Example 1 were employed except that the reaction gases used were $CO_2$—$C_3H_8$ with flow rates of 30.0 ml/min and 8.6 ml/min respectively. After a total deposition time of 3 hours, a 6 μm thick diamond film of good crystallinity was obtained as shown in FIG. 4. The growth rate of the diamond film was 2 μm/hr. To obtain a high quality diamond film, when the flow rate of $CO_2$ is kept at 30.0 ml/min, the flow rate of $C_3H_8$ is preferably maintained in the 7.9–9 ml/min range.

EXAMPLE 4

Figure 5:
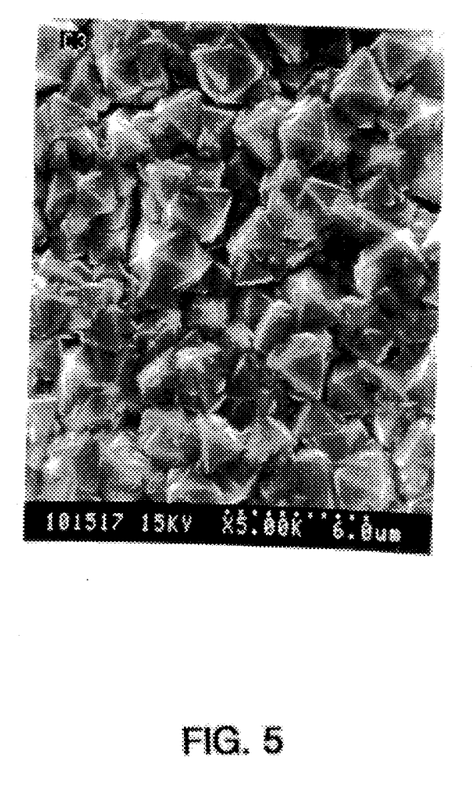
FIG. 5 is the SEM micrograph of the diamond film obtained from Example 4 of the present invention.

The same apparatus and process as described in Example 1 were employed except that the reaction gases used were $CO_2$—$C_3H_6O_3$ with flow rates of 1.35 ml/min and 20 ml/min respectively. After a total deposition time of 3 hours, a 11 μm thick diamond film of good crystallinity was obtained as shown in FIG. 5. The growth rate of the diamond film was 3.67 μm/hr. To obtain a high quality diamond film, when the flow rate of $C_3H_6O_3$ is kept at 20 ml/min, the flow rate of $CO_2$ is preferably maintained in the 1.2–1.6 ml/min range.

EXAMPLE 5

Figure 6A:
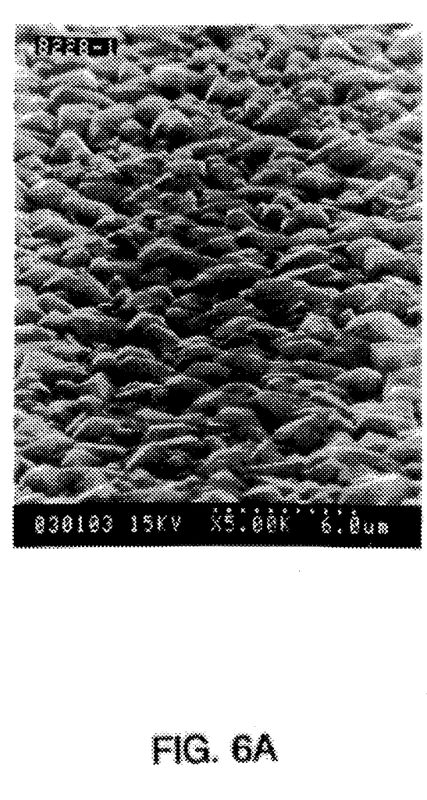
FIGS. 6a and 6b are the SEM image of surface morphology and cross-sectional view of the diamond film obtained from Example 5 of the present invention respectively.
Figure 6B:
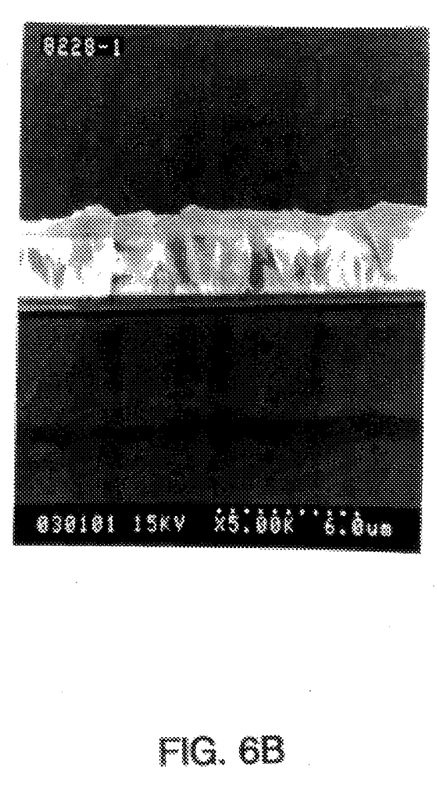

The same apparatus and process as described in Example 1 were employed except that the reaction gases used were $CO_2$—$CH_4$ with flow rates of 30.0 ml/min and 18.0 ml/min respectively, the pressure was 25 torr, the input microwave power was 290 W, the substrate temperature was 340° C., and the total deposition time was 24 hours. The growth rate of the diamond film was 0.3 μm/hr, and that of the diamond granule as 0.8 μm/hr. The SEM image of surface morphology and cross-sectional view of the obtained diamond film were shown in FIGS. 6a and 6b respectively. To obtain a high quality diamond film, when the flow rate of $CO_2$ is kept at 30.0 ml/min, the flow rate of $CH_4$ is preferably maintained in the 17–21 ml/min range.

EXAMPLE 6

Figure 7:
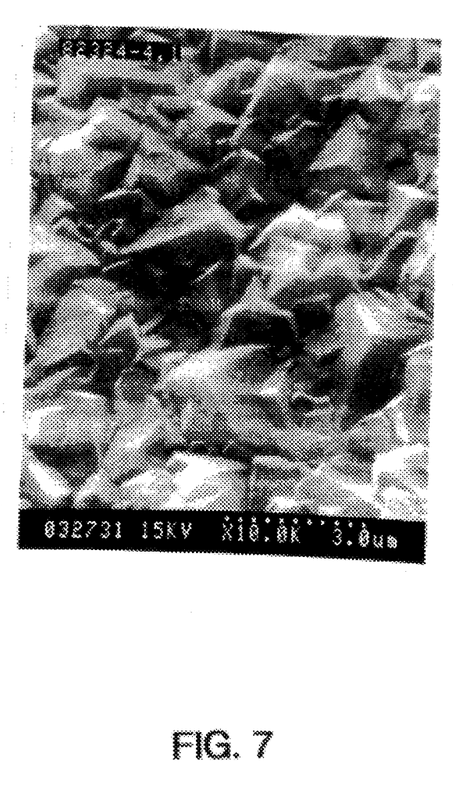
FIG. 7 is the SEM image of surface morphology of the diamond film obtained from Example 6 of the present invention.

The same apparatus and process as described in Example 5 were employed except that the total deposition time was 4 hours. The SEM image of surface morphology of the obtained diamond film was shown in FIG. 7. It proves that, at such a condition, only 4 hours are needed to obtain a high quality and continuous diamond film.

EXAMPLE 7

Figure 8:
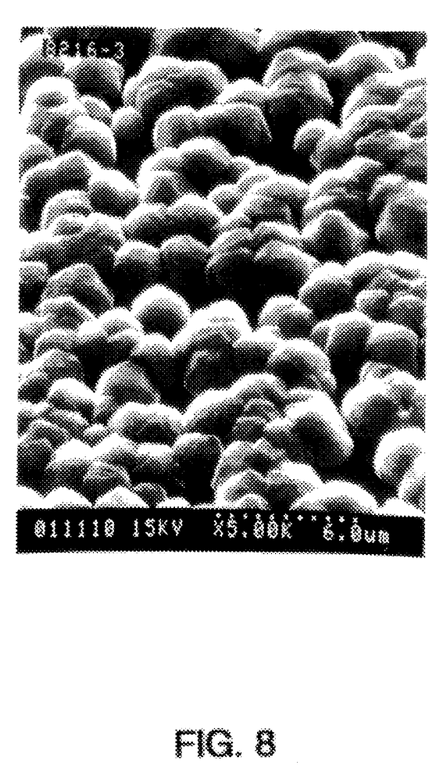
FIG. 8 is the SEM image of surface morphology of the diamond film obtained from Example 7 of the present invention.

The same apparatus and process as described in Example 1 were employed except that the reaction gases used were $CO_2$—$CH_4$ with flow rates of 30.0 ml/min and 20.5 ml/min respectively, the pressure was 25 torr, the input microwave power was 290 W, the substrate temperature was 340° C., and the total deposition time was 3 hours. The growth rate of the diamond film was 0.3 μm/hr. The SEM image of surface morphology of the obtained diamond film was shown in FIG. 8.

EXAMPLE 8

Figure 9:
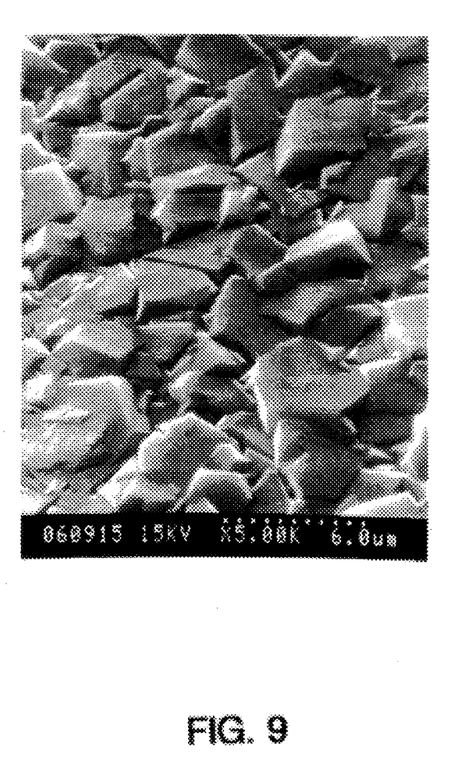
FIG. 9 is the SEM image of surface morphology of the diamond film obtained from Example 8 of the present invention.

The same apparatus and process as described in Example 1 were employed except that the reaction gases used were $CO_2$—$CH_4$ with flow rates of 30.0 ml/min and 17.5 ml/min respectively, the pressure was 25 torr, the input microwave power was 290 W, the substrate temperature was 300° C., and the total deposition time was 24 hours. The growth rate of the diamond film was 0.25 μm/hr. The SEM image of surface morphology of the obtained diamond films was shown in FIG. 9. To obtain in a high quality diamond film, when the flow rate of $CO_2$ is kept at 30.0 ml/min, the flow rate of $CH_4$ is preferably maintained in the 16–20 ml/min range.

EXAMPLE 9

Figure 10:
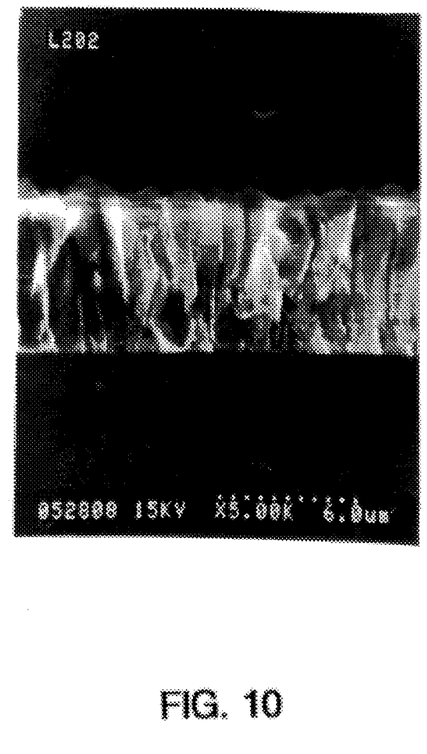
FIG. 10 is the cross-sectional view of the diamond film obtained from Example 9 of the present invention.

The same apparatus and process as described in Example 1 were employed except that the reaction gases used were $CO_2$—$CH_4$ with flow rates of 30.0 ml/min and 17.0 ml/min respectively, the pressure was 10 torr, the input microwave power was 290 W, the substrate temperature was 270° C., and the total deposition time was 24 hours. The growth rate of the diamond film was 0.24 μm/hr. The cross-sectional view of the obtained diamond film was shown in FIG. 10. To obtain a high quality diamond film, when the flow rate of $CO_2$ is kept at 30.0 ml/min, the flow rate of $CH_4$ is preferably maintained in the 16–20 ml/min range.

EXAMPLE 10

Figure 11A:
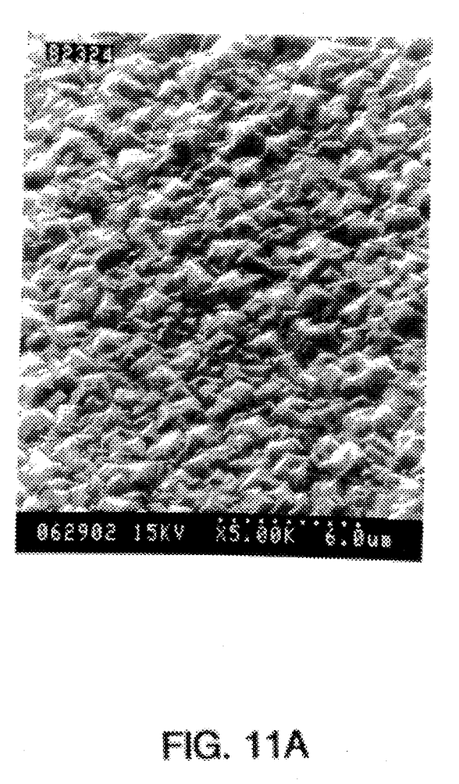
FIGS. 11a and 11b are the SEM image of surface morphology and cross-sectional view of the diamond film obtained from Example 10 of the present invention respectively.
Figure 11B:
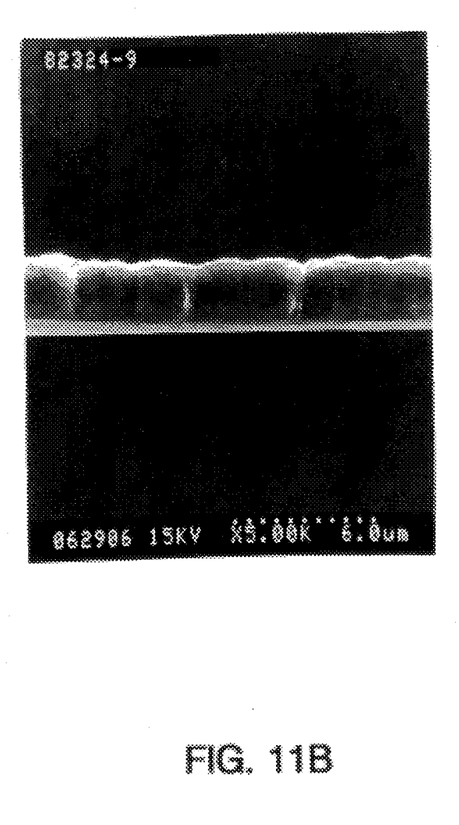

The sane apparatus and process as described in Example 1 were employed except that the reaction species used were $CO_2$—$CH_4$ with flow rates of 30.0 ml/min and 16.9 ml/min respectively, the pressure was 4 torr, the input microwave power was 290 W, the substrate temperature was 180° C., and the total deposition time was 24 hours. The growth rate of the diamond film was 0.13 μm/hr. The SEM image of surface morphology and cross-sectional view of the obtained diamond film were shown in FIGS. 11a and 11b respectively. To obtain a high quality diamond film, when the flow rate of $CO_2$ is kept at 30.0 ml/min, the flow rate of $CH_4$ is preferably maintained in the 16–19 ml/min range.

What is claimed is:

1. A process for depositing diamond on a substrate using a chemical vapor deposition (CVD) process, which comprises contacting a substrate with a two-component gas mixture without supplying additional hydrogen gas, under the conditions of a substrate temperature of 150° C. to below 700° C., a pressure of 1–50 torr, an input power of 250–450 W, wherein the two-component gas mixture is selected from the group consisting of a hydrocarbon ($C_xH_y$) plus $CO_2$ with a flow rate ratio of the $C_xH_y$ to $CO_2$ of 0.20–0.8, and a gasified liquid state oxygen-containing hydrocarbon ($C_xH_yO_z$) to $CO_2$ of 12–17, and wherein x is an integer from 1 to 6; y is an integer from 1 to 10; and z is an integer from 1 to 3.

2. The process as claimed in claim 1, wherein the CVD process is a microwave plasma CVD process.

3. The process as claimed in claim 1, wherein the CVD process is an R.F. plasma CVD process.

4. The process as claimed in claim 1, wherein the CVD process is a hot filament CVD process.

5. The process as claimed in claim 1, wherein the $C_xH_y$ is selected from the group consisting of $CH_4$, $C_2H_2$, $C_2H_4$, $C_3H_8$, $C_4H_{10}$ and $C_6H_6$.

6. The process as claimed in claim 5, wherein the $C_xH_y$ is $C_2H_2$.

7. The process as claimed in claim 5, wherein the $C_xH_y$ is $CH_4$.

8. The process as claimed in claim 5, wherein the $C_xH_y$ is $C_3H_8$.

9. The process as claimed in claim 1, wherein the $C_xH_yO_z$ is selected from the group consisting of $C_3H_6O_3$, $CH_3OH$, $CH_3COCH_3$, $CH_3COOCH_3$, $C_2H_5OH$ and $C_2H_5OC_2H_5$.

10. The process as claimed in claim 1, wherein the $C_xH_yO_z$ is $C_3H_6O_3$.

11. The process as claimed in claim 6, wherein the pressure is 25 torr, the input power is microwave power at 400 W, and the flow rates of $CO_2$ and $C_2H_2$ are 30 ml/min and 13.8–14.5 ml/min, respectively.

12. The process as claimed in claim 7, wherein the pressure is 25 torr, the input power is microwave power at 400 W, and the flow rates of $CO_2$ and $CH_4$ are 30 ml/min and 20.6–21.7 ml/min, respectively.

13. The process as claimed in claim 7, wherein the substrate temperature is 340° C., the pressure is 25 torr, the input power is microwave power at 290 W, and the flow rates of $CO_2$ and $CH_4$ are 30 ml/min and 17–21 ml/min, respectively.

14. The process as claimed in claim 7, wherein the substrate temperature is 300° C., the pressure is 25 torr, the input power is microwave power at 290 W, and the flow rates of $CO_2$ and $CH_4$ are 30 ml/min and 17–21 ml/min, respectively.

15. The process as claimed in claim 7, wherein the substrate temperature is 270° C., the pressure is 10 torr, the input power is microwave power at 290 W, and the flow rates of $CO_2$ and $CH_4$ are 30 ml/min and 17–21 ml/min, respectively.

16. The process as claimed in claim 7, wherein the substrate temperature is 180° C., the pressure is 4 torr, the input power is microwave power at 290 W, and the flow rates of $CO_2$ and $CH_4$ are 30 ml/min and 16–19 ml/min, respectively.

17. The process as claimed in claim 8, wherein the pressure is 25 torr, the input power is microwave power at 400 W, and the flow rates of $CO_2$ and $C_3H_8$ are 30 ml/min and 7.9–9 ml/min, respectively.

18. The process claimed in claim 10, wherein the pressure is 25 torr, the input power is microwave power at 400 W, and the flow rates of $CO_2$ and $C_3H_6O_3$ are 0.12–1.6 ml/min and 20 ml/min, respectively.

19. The process of claim 1 wherein the substrate temperature is 150° C. to below 400° C.

* * * * *